(12) United States Patent
Wolf

(10) Patent No.: US 12,087,501 B2
(45) Date of Patent: Sep. 10, 2024

(54) IN-SITU MEASUREMENT AND FEEDBACK CONTROL OF ADDITIVELY MANUFACTURED ELECTRICAL PASSIVE COMPONENTS

(71) Applicant: Honeywell Federal Manufacturing & Technologies, LLC, Kansas City, MO (US)

(72) Inventor: Joseph Ambrose Wolf, Olathe, KS (US)

(73) Assignee: Honeywell Federal Manufacturing & Technologies, LLC, Kansas City, MO (US)

(*) Notice: Subject to any disclaimer, the term of this patent is extended or adjusted under 35 U.S.C. 154(b) by 0 days.

(21) Appl. No.: 17/698,326

(22) Filed: Mar. 18, 2022

(65) Prior Publication Data

US 2022/0375684 A1 Nov. 24, 2022

Related U.S. Application Data

(60) Provisional application No. 63/191,555, filed on May 21, 2021.

(51) Int. Cl.
*H01F 41/04* (2006.01)
*B22F 10/85* (2021.01)
(Continued)

(52) U.S. Cl.
CPC ............ *H01F 41/043* (2013.01); *B22F 10/85* (2021.01); *B22F 12/90* (2021.01); *B28B 1/001* (2013.01);
(Continued)

(58) Field of Classification Search
CPC ..... B29C 64/393; B29C 64/118; B28B 1/001; B28B 17/0081; H01C 17/065; B29L 2031/3406; H05K 1/167
See application file for complete search history.

(56) References Cited

U.S. PATENT DOCUMENTS 6,940,038 B2   9/2005   Biunno et al.
8,763,240 B2   7/2014   Bendix et al.
(Continued)

OTHER PUBLICATIONS

Dijkshoorn, Alexander & Neuvel, Patrick & Stramigioli, Stefano & Krijnen, Gijs. (2020). In-Situ Monitoring of Layer-Wise Fabrication by Electrical Resistance Measurements in 3D Printing. 10.1109/SENSORS47125.2020.9278632. (Year: 2020).*

(Continued)

*Primary Examiner* — Alison L Hindenlang
*Assistant Examiner* — Erica Hartsell Funk
(74) *Attorney, Agent, or Firm* — Erise IP, P.A.

(57) ABSTRACT

Systems and methods of additively manufacturing passive electronic components are provided. An additive manufacturing device may deposit a material to create a passive electronic component. A sensor may continuously measure an electrical property of the passive electronic component across two electrical contacts as the material is deposited during manufacturing. The sensor may transmit the measured electrical property to a processor whereby the processor may adjust a material deposition rate of the additive manufacturing device. The continuous measurement of the electrical property and adjustment of the material deposition rate as the passive electronic component is produced allows for passive electronic components to be manufactured to a high degree of accuracy of the electrical property.

20 Claims, 5 Drawing Sheets

(51) Int. Cl.
    *B22F 12/90*     (2021.01)
    *B28B 1/00*     (2006.01)
    *B28B 17/00*     (2006.01)
    *B29C 64/393*     (2017.01)
    *B33Y 10/00*     (2015.01)
    *B33Y 30/00*     (2015.01)
    *B33Y 50/02*     (2015.01)
    *B33Y 80/00*     (2015.01)
    *H01C 17/065*     (2006.01)
    *H01G 4/33*     (2006.01)
    *B29L 31/34*     (2006.01)
    *H05K 1/16*     (2006.01)

(52) U.S. Cl.
    CPC ........ *B28B 17/0081* (2013.01); *B29C 64/393* (2017.08); *B33Y 10/00* (2014.12); *B33Y 30/00* (2014.12); *B33Y 50/02* (2014.12); *B33Y 80/00* (2014.12); *H01C 17/065* (2013.01); *H01G 4/33* (2013.01); *B29L 2031/3406* (2013.01); *H05K 1/162* (2013.01); *H05K 1/165* (2013.01); *H05K 1/167* (2013.01)

(56) References Cited

U.S. PATENT DOCUMENTS

| | | | |
|---|---|---|---|
| 10,254,499 B1* | 4/2019 | Cohen | B29C 64/321 |
| 10,462,907 B2 | 10/2019 | Lewis et al. | |
| 2006/0158478 A1 | 7/2006 | Howarth | |
| 2014/0042657 A1* | 2/2014 | Mulliken | B29C 64/118 |
| | | | 425/113 |
| 2015/0201500 A1 | 7/2015 | Shinar | |
| 2018/0304550 A1* | 10/2018 | Atherton | G05B 19/29 |
| 2019/0152137 A1* | 5/2019 | Chaffins | H05K 1/095 |

OTHER PUBLICATIONS

Jaksic (Procedia Manufacturing, 2018) (Year: 2018).*

\* cited by examiner

IN-SITU MEASUREMENT AND FEEDBACK CONTROL OF ADDITIVELY MANUFACTURED ELECTRICAL PASSIVE COMPONENTS

RELATED APPLICATION

This application claims the benefit of U.S. Provisional Application 63/191,555, filed May 21, 2021, which is incorporated herein by reference.

STATEMENT OF GOVERNMENTAL SUPPORT

This invention was made with government support under DE-NA0002839 awarded by the United States Department of Energy/National Nuclear Security Administration. The government has certain rights in the invention.

BACKGROUND

1. Field

Embodiments of the invention relate to a process and system for manufacturing passive electronic components. More specifically, embodiments of the invention relate to controlling the manufacture of passive electronic components based on the electrical property of the passive components.

2. Related Art

Passive electronics are conventionally manufactured through a combination of additive and subtractive manufacturing methods. Typically, the resistive, capacitive, or inductive material will be deposited onto a surface and portions of the material are then removed to create the final component. Circuits may be constructed with the manufactured components using surface mount technologies, in which electronic components are directly mounted onto a printed circuit board (PCB), and/or through-hole technologies, in which leads are inserted through a hole in the PCB and soldered on an opposite side of the PCB. These conventional methods are time-consuming, especially for prototyping, and also have high material waste and high costs.

Fully additively manufacturing electronic components has thus become a popular method for rapidly producing electronics. Additive manufacturing allows for components to be manufactured with less material waste and for quicker rapid prototyping of components and PCBs as compared to conventional methods. Additively manufactured parts can also be manufactured on non-planar surfaces, in what is known as conformal printing. However, current additive manufacturing techniques for passive components lack methods for producing components with near exact electrical properties (i.e., resistance, capacitance, or inductance). Because any amount of material that is printed for the component will change an electrical property of the component, any deviation in the amount of material printed will cause a deviation in the final electrical property of the material.

Current methods of manufacturing electronic components by additive manufacturing comprise calculating an amount of material needed to achieve an electrical property then manufacturing and experimentally testing the component. When a desired electrical property is achieved with an amount of material and a specific geometry, the electronic component can then be mass produced.

There are several drawbacks to this process. When the geometry and the amount of material is defined, the additive manufacturing device deposits the material. The material for the electronic component is deposited on the substrate according to the stored geometry. This process has inherent error that creates inaccuracy across the production for the components. As such, the electrical property of the electronic components have inherent error based on the error in the material deposited for the component. Furthermore, as the process continues producing more and more components, the error builds over time creating more error in the electrical properties of the components. This error must be monitored, and when the error surpasses a threshold, the additive manufacturing device needs to be recalibrated.

Accordingly, industries that require highly accurate passive electronic components such as, for example, the high-speed communications industry, may not use additive manufacturing because of the above-described deficiencies. As such, what is needed is a system for tightly controlling the electrical properties of passive components as they are additively manufactured such that they can be built to a high degree of accuracy.

SUMMARY

Embodiments of the invention solve the above-described problems by providing systems and methods for the precise additive manufacturing of passive electronic components by using a feedback loop to constantly monitor an electrical property of the passive electronic component during manufacturing. As the passive electronic component is being manufactured, the material deposition rate may be adjusted based on the feedback of the measured electrical property.

A first embodiment is directed to a system for additively manufacturing passive electronic components, the system comprising a first electrical contact, a second electrical contact, an additive manufacturing device configured to deposit a print material onto a substrate, a sensor operably connected to the first electrical contact and the second electrical contact and configured to measure an electrical property across the first electrical contact and the second electrical contact, and one or more non-transitory computer-readable media storing computer-executable instructions that, when executed by a processor, perform a method of receiving, from the sensor, a first signal indicative of the measured electrical property, sending a second to the additive manufacturing device based on the first signal, wherein the second signal adjusts a material deposition rate for the additive manufacturing device, determining if the measured electrical property has reached a threshold value, and when the measured electrical property reaches the threshold value, the second signal adjusts the material deposition rate to be zero, whereby no material is added to the substrate.

A second embodiment is directed to a method for additively manufacturing passive electronic components, the method comprising the steps of depositing a first amount of a print material onto a substrate using an additive manufacturing device, measuring an electrical property across a first electrical contact and a second electrical contact using a sensor, transmitting the measured electrical property to a processor, adjusting a material deposition rate of the additive manufacturing device based on the measured electrical property and a threshold value, depositing a second amount of the print material onto the substrate, determining when the measured electrical property has reached the threshold value, and when the measured electrical property has reached the threshold value, ending the deposition of the print material.

A third embodiment is directed to a passive electronic component having a predefined electrical property, said passive electronic component produced by an additive manufacturing process including a feedback loop, the passive electronic component comprising a first electrical contact, and a second electrical contact, wherein the passive electronic component is a resistor, a capacitor, or an inductor, said additive manufacturing process comprising depositing a print material onto a substrate using an additive manufacturing device, repeatedly measuring an electrical property across the first electrical contact and the second electrical contact during the depositing, and adjusting a material deposition rate of the additive manufacturing device based on the measured electrical property to achieve the predefined electrical property in the produced passive electronic component.

Another embodiment is directed to a system for additively manufacturing passive electronic components, the system comprising a first electrical contact, a second electrical contact, an additive manufacturing device configured to deposit a print material onto a substrate, a sensor operably connected to the first electrical contact and the second electrical contact and configured to measure an electrical property across the first electrical contact and the second electrical contact, and one or more non-transitory computer-readable media storing computer-executable instructions that, when executed by a processor, perform a method of receiving, from the sensor, a first signal indicative of the measured electrical property, sending a second to the additive manufacturing device based on the first signal, wherein the second signal adjusts a material deposition rate for the additive manufacturing device, determining if the measured electrical property has reached a threshold value, and when the measured electrical property reaches the threshold value, the second signal adjusts the material deposition rate to be zero, whereby no material is added to the substrate, wherein the passive electronic component is a resistor, and the measured electrical property is resistance, and wherein the print material is deposited between the first electrical contact and the second electrical contact.

Still another embodiment is directed to a system for additively manufacturing passive electronic components, the system comprising a first electrical contact, a second electrical contact, an additive manufacturing device configured to deposit a print material onto a substrate, a sensor operably connected to the first electrical contact and the second electrical contact and configured to measure an electrical property across the first electrical contact and the second electrical contact, and one or more non-transitory computer-readable media storing computer-executable instructions that, when executed by a processor, perform a method of receiving, from the sensor, a first signal indicative of the measured electrical property, sending a second to the additive manufacturing device based on the first signal, wherein the second signal adjusts a material deposition rate for the additive manufacturing device, determining if the measured electrical property has reached a threshold value, and when the measured electrical property reaches the threshold value, the second signal adjusts the material deposition rate to be zero, whereby no material is added to the substrate, wherein the passive electronic component is a capacitor, and the measured electrical property is capacitance, wherein the first electrical contact is a pre-determined size, and wherein the print material is deposited opposite a dielectric material to increase the capacitance.

Yet another embodiment is directed to a system for additively manufacturing passive electronic components, the system comprising a first electrical contact, a second electrical contact, an additive manufacturing device configured to deposit a print material onto a substrate, a sensor operably connected to the first electrical contact and the second electrical contact and configured to measure an electrical property across the first electrical contact and the second electrical contact, and one or more non-transitory computer-readable media storing computer-executable instructions that, when executed by a processor, perform a method of receiving, from the sensor, a first signal indicative of the measured electrical property, sending a second to the additive manufacturing device based on the first signal, wherein the second signal adjusts a material deposition rate for the additive manufacturing device, determining if the measured electrical property has reached a threshold value, and when the measured electrical property reaches the threshold value, the second signal adjusts the material deposition rate to be zero, whereby no material is added to the substrate, wherein the passive electronic component is an inductor, and the measured electrical property is inductance, and wherein the first electrical contact is the print material deposited to create the inductor, and the second electrical contact is a print head of the additive manufacturing device.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
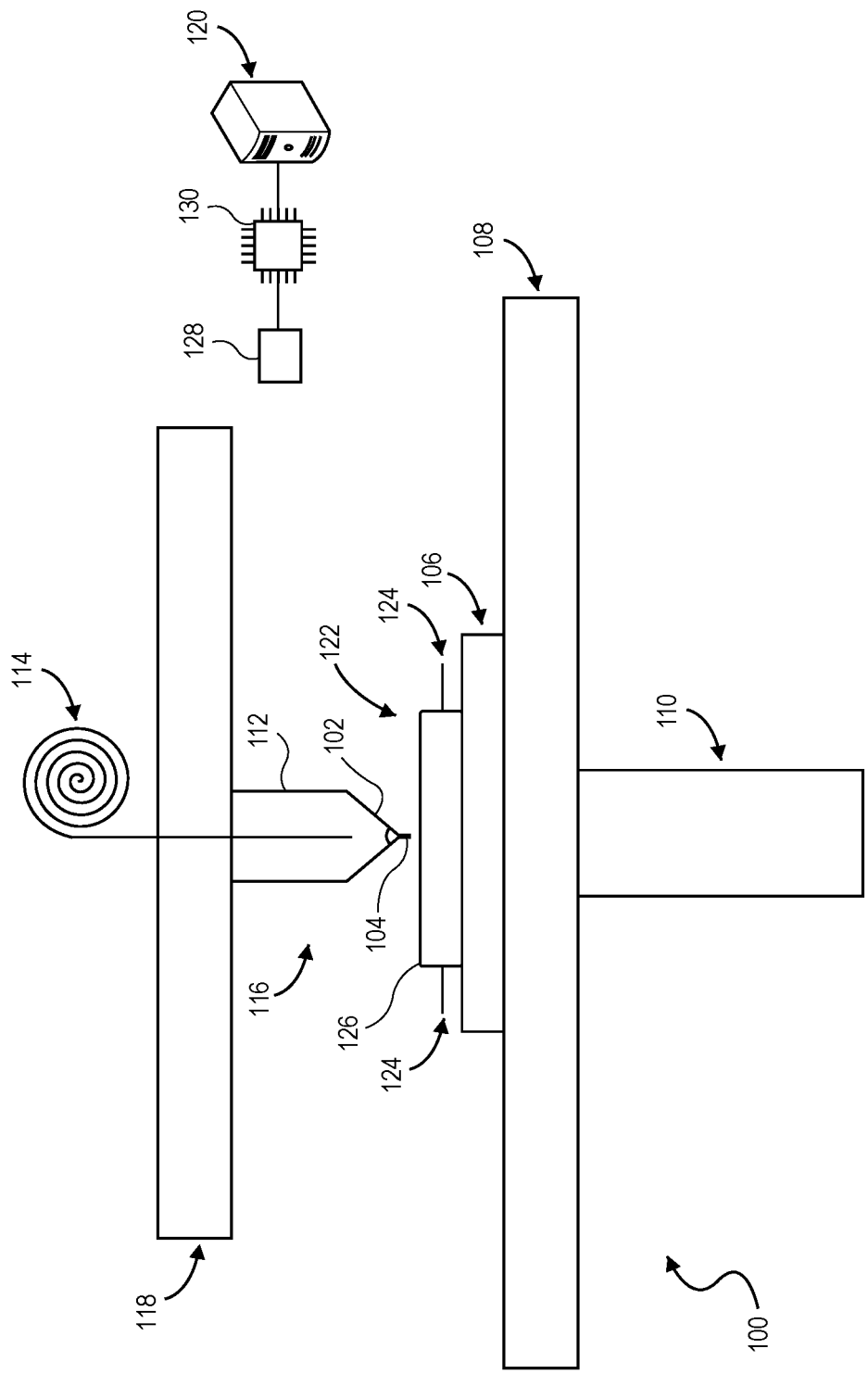
FIG. 1 illustrates an embodiment of the invention for printing a resistor using an additive manufacturing device.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

Passive electronics can be manufactured in a variety of different ways. Typically, passive electronics are manufactured in a multi-step process that includes a series of subtractive processes such as laser ablation. These traditional methods are time-consuming and prone to variance in the produced components. Additively manufacturing passive electronics has thus become a popular alternative to address the shortcomings of traditional manufacturing. Additive manufacturing, also referred to as three-dimensional (3D) printing, is a manufacturing technique in which a component is built by depositing material onto a substrate layer by layer until the component is complete. Generally, a 3D computer-aided design (CAD) model of the component is designed and then transferred to a computer controlling a 3D printer. The computer uses the instructions from the CAD model (typically in the form of a .STL file) to direct the 3D printer to print the build material at the correct coordinates.

Passive electronics are typically additively manufactured using material jetting or material extrusion methods such as inkjet printing or fused filament fabrication (FFF); however, any type of additive manufacturing process, including VAT polymerization, binder jetting, powder bed fusion, sheet lamination, and/or directed energy deposition, may be used with the systems and methods described herein.

Generally, embodiments of the invention are directed to systems and methods for the additive manufacture of passive electronic components. Passive electronic components are electronic components that are incapable of power gain and comprise resistors, capacitors, inductors, diodes, transformers, voltage sources, and power sources. In some embodiments, a feedback control loop is employed to constantly monitor an electrical property of a passive electronic component produced by an additive manufacturing device during manufacturing.

In some embodiments, the rate at which material is deposited, and thus components are produced, may be adjusted based on the desired tolerance of the components. For example, in a circuit, use case may dictate that an inductor and/or a resistor be manufactured to a tolerance of ±10% of the desired operational inductance and resistance, respectively, while a capacitor be manufactured to a tolerance of ±0.5% of the desired operational capacitance. The systems and methods described herein may be used to rapidly print the inductor and/or the resistor, while the capacitor may be printed at a slower rate to ensure a tighter tolerance. Therefore, the system provides for both highly efficient and highly accurate manufacturing processes to be achieved.

In some embodiments, the components may be sintered together and/or sintered to a substrate prior to, during, or after the printing process. For example, in manufacturing capacitors it is common to sinter the bottom capacitor plate to the substrate to prevent cracking of the component and/or the absorption of a dielectric layer into the bottom capacitor plate.

In some embodiments, additional components may be added to the passive components. For example, capacitors are often produced having a dielectric layer between the two capacitor plates. The dielectric layer serves to increase the charge capacity of the capacitor. In some embodiments, the dielectric layer may comprise glass, ceramic, air or any other nonconductive material now known or later developed. In still other embodiments, components may be printed on top of an insulating layer.

The additive manufacture of resistors, capacitors, and inductors and other passive components allows for a wide range of electronic components to be constructed because the passive electronic components serve as the basis for many circuits and electronics. For example, high pass filters, low pass filters, transformers, as well as many other standard components can be constructed. Further, the passive components can be integrated with active components to create a variety of electronics.

FIG. 1 depicts an additive manufacturing device 100 printing a passive component. FIG. 1 is not intended to be restrictive, rather depicting generic components typically found in additive manufacturing devices. As depicted, additive manufacturing device 100 is similar to a fused filament fabrication additive manufacturing machine; however, additive manufacturing device 100 may be any additive manufacturing device as described above, such as, for example, an inkjet printer or a powder bed fusion machine. In some embodiments, additive manufacturing device 100 comprises a print head 102 that deposits material 104 onto substrate 106 of print bed 108. Print head 102 may be a nozzle capable of dispensing material 104 at variable rates to meet the description of the invention, as described below. In some embodiments, print head 102 may comprise various components necessary for dispensing material 104. For example, print head 102 may comprise heating elements operable to heat material 104, thus reducing viscosity of the material and making deposition easier. In other embodiments, print head 102 may be coated with friction-reducing materials to aid in delivering material 104 out of print head 102.

In some embodiments, print bed 108 is disposed on and supported by base 110. As depicted, print bed 108 is rectangular; however, print bed 108 may take any geometrical shape such as circular, triangular, or square. Likewise, base 110 may take any geometrical shape capable of supporting print bed 108 and substrate 106. In some embodiments, base 110 may be omitted with print bed 108 providing sole support for substrate 106. In some embodiments, substrate 106 may be any desired shape and the passive electronic component is designed to be printed in place.

In some embodiments, material 104 may be any material having the desired electrical properties of the component to be printed. For example, material 104 may be a thermoplastic, paste, ink, metal, or the like, or a combination thereof. Material 104 may be fed into print head 102 through extruder 112 from reservoir 114. In some embodiments, extruder 112 is not present. For example, in binder jetting processes, powder is sprayed through a nozzle and out of print head 102 onto print bed 108 whereby a roller smooths the powder, and print bed 108 is then moved vertically to facilitate printing of the next layer of material 104. As shown, reservoir 114 is a spool of filament of material 104. However, reservoir 114 is not limited to filament spools and may be any apparatus operable to hold material 104. For example, reservoir 114 may instead be a powder reservoir in embodiments where powder is used as material 104.

Print head 102 and extruder 112 form assembly 116 which may be supported by frame 118. While frame 118 is depicted simplistically as a rectangular cross-bar, frame 118 may encompass the entirety of additive manufacturing device 100 and may support base 110. Frame 118 may be operable to move assembly 116 laterally along the x-axis, longitudinally along the y-axis, and/or vertically along the z-axis. In some embodiments, frame 118 may be operable to move assembly 116 around five or six axes, with the fourth, fifth, and sixth axes being rotational axes about the x-axis, y-axis, and z-axis, respectively. Some such embodiments may utilize a five-axis or a six-axis additive manufacturing device 100 to facilitate conformal printing of passive electronic components on non-planar surfaces of substrates. In other embodiments, print bed 108 and/or base 110 may be operable to move in each of the aforementioned directions, thus allowing for the component to be built three-dimensionally.

In some embodiments, additive manufacturing device 100 is connected to and controlled by computer 120. Computer 120 may be operable to read data, such as .STL, .obj or .amf, or any other file format used by CAD software that describes the surface geometry of a component. Computer 120 may comprise at least one processor 130, a transmitter, a receiver, a server, a memory, and any components necessary for electrically communicating information between components and connecting to a local network and the Internet. In some embodiments, the processor 130 may be referenced as a controller and configured to receive the output of a sensor 128 sensing the electrical property of the electronic component and controlling the deposition rate of the material 104. Computer 120 may comprise one or more non-transitory computer-readable media storing computer-executable instructions that, when executed by the at least one processor 130, receive the output of the sensor 128 sensing the electrical property of the electronic component and controlling the deposition rate of the material 104. Computer 120 may comprise an electronic display operable to display visual graphics, images, text, etc. In some embodiments, the electronic display may be a peripheral component or may be attached to a second computer. Computer 120 may transmit the information either by wire or wirelessly to the second computer for display and processing by the at least one processor 130.

As depicted in FIG. 1, additive manufacturing device 100 is being used to fabricate resistor 122. In the exemplary embodiment depicted in FIG. 1, resistor 122 comprises two main parts: electrical contacts 124 and resistor body 126, with resistor body 126 comprising material 104. In some embodiments, electrical contacts 124 may be added after resistor body 126 has been at least partially or fully printed. As shown, resistor 122 is disposed on top of substrate 106; however, in some embodiments, resistor 122 may be manufactured directly onto print bed 108 and substrate 106 may not be present. In other embodiments, substrate 106 may be a printed circuit board and resistor 122 built directly therein or thereupon. In still other embodiments, substrate 106 may be a flexible surface operable to receive material 104 thereupon. Accordingly, in some embodiments, additive manufacturing device 100 may be operable to print directly on the contours of non-planar substrates. Thus, some embodiments allow for devices, whose performance is dependent on its shape, such as antennas, to be manufactured to a high degree of accuracy of both geometric shape and electrical property.

As depicted, electrical contacts 124 are lead lines of resistor 122. However, electrical contacts 124 are not limited to lead lines and may take a variety of forms. Electrical contacts 124 may change depending on which passive component is being fabricated. For example, in some embodiments in which a capacitor is being fabricated, the two electrodes of the capacitor may serve as electrical contacts 124. Electrical contacts 124 may be any conductive material that can pass an electrical current such that an electrical property can be measured. For example, electrical contacts 124 may be at least one of gold, silver alloys, platinum, carbon, aluminum, copper, copper alloys, steel, stainless steel, tin, or any other known conductive material now known or later developed.

Additive manufacturing device 100 also includes sensor 128 that is operably connected to electrical contacts 124 and configured to measure an electrical property across the electronic component. In the case of FIG. 1, where resistor 122 is manufactured, the electrical property may be resistance. Accordingly, when a capacitor is built, the electrical property measured may be capacitance. Likewise, sensor 128 may detect inductance in embodiments where inductors are produced. Consequently, sensor 128 may be an LCR meter that is configured to measure resistance, capacitance, and inductance. Alternatively, sensor 128 may be an ohmmeter, a capacitance meter, a multimeter, or the like, or any combination thereof.

In some embodiments, sensor 128 may transmit data to processor 130. In some embodiments, computer 120 comprises processor 130. Processor 130 may execute computer-executable instructions as described above. Processor 130 may comprise, additional processors, microprocessors, microcontrollers, field programmable gate arrays, and the like, or combinations thereof. Broadly speaking, when processor 130 receives data from sensor 128, processor 130 transmits a signal to at least one actuator of the additive manufacturing device decreasing a material deposition rate, increasing the material deposition rate, or ending the material deposition process. In some embodiments, the material deposition rate represents the amount of material deposited by additive manufacturing device 100 over a period of time such as, for example, mm$^3$/min.

In some embodiments, the material deposition rate may slow as the measured electrical property value of the passive component nears its desired operational value. For example, if a 0.1 µF capacitor is to be printed, when sensor 128 measures a capacitance value of 0.08 µF (as the capacitance increases as material is added), processor 130 may instruct computer 120 to slow the material deposition rate to a rate of mm$^3$/min to ensure sensor 128 is reading the correct capacitance without delay such that no excess material is added. As most passive components are built to be quite small in size (e.g., a common 0.1 µF capacitor is about 5 mm long), having even a small amount of excess material deposited could produce a component comprising an electrical property value outside of the desired operational tolerance range.

In other embodiments, the material deposition rate may increase if sensor 128 detects an electrical property value that is not close to the desired value. For example, prior to an initial deposition of material that connects electrical contacts 124, resistor 122 has an infinite resistance. Thus, when just enough material 104 is deposited to connect electrical contacts 124, sensor 128 will measure resistor 122 as having a large resistance relative to the desired resistance. In most cases, the high resistance may not be near the desired operational resistance of resistor 122. In such a case, processor 130 may instruct computer 120 to deposit material 104 at a relatively high material deposition rate as the threshold to stop deposition is not close. Then, as described above, once the detected resistance nears its final value, processor 130 may instruct computer 120 to slow the material deposition rate to ensure the exact amount or near exact amount of material is deposited to form resistor 122.

In some embodiments, once sensor 128 and processor 130 detect that the passive electronic component has reached its desired operational value during the fabrication process, processor 130 may send a signal to actuate the additive manufacturing device 100, reducing the material deposition to zero and ending the fabrication process. In some embodiments, a lag may be present between measuring the electrical property value and depositing the material 104 via additive manufacturing device 100. In some such embodiments, processor 130 may be configured to signal additive manufacturing device 100 to end the deposition of material 104 prior to the measured electrical property value reaching the threshold value, or the exact desired value of the electrical property. Thus, any material 104 that may be deposited during the process of sensor 128 detecting the measured electrical property value and processor 130 signaling the actuator to end material 104 deposition will not cause the electrical property value of the final component to be erroneous. For example, if a 0.5 millihenry inductor is fabricated and it is known that in the time it takes for sensor 128 to measure the electrical property value, transmit the electrical property value to processor 130, and for processor 130 to signal to additive manufacturing device 100 to adjust its material deposition rate and deposit the material, the amount of material 104 deposited will cause a 0.05-milliHenry increase in the inductance of the inductor, processor 130 may be configured to signal additive manufacturing device 100 to end printing when sensor 128 measures a value of 0.45-milliHenries. Thus, the additional material deposited after sensor 128 measures 0.45-milliHenries will increase the inductance of the inductor to 0.5-milliHenries.

In some embodiments, sensor 128 may be configured to measure and transmit data in addition to the electrical properties. For example, sensor 128 may be configured to detect the position of print head 102 and/or print bed 108 such that it can monitor the position of print head 102 relative to the passive component and/or monitor the position of print bed 108 relative to print head 102. In some embodiments, multiple sensors 128 may be provided. In some embodiments, passive components may be printed to have variable cross sections. In some such embodiments, sensor 128 may transmit positional data to processor 130 whereby processor 130 may signal computer 120 to further adjust the material deposition rate based on the positional data. For example, additive manufacturing device 100 may print conductors for use in an RFID antenna in which it may be desirable for the conductors to be fabricated in abstract shapes conforming to the contours of the antenna. Thus, as additive manufacturing device 100 deposits material 104, processor 130, in cooperation with sensor 128, may signal additive manufacturing device 100 to adjust deposition such that the conductor can fit into or onto the desired contour. Because sensor 128 and processor 130 constantly measure the electrical property and adjust the material deposition rate, components can be printed to have any geometrical shape without having concerns related to the electrical property accuracy of the printed component.

Figure 2:
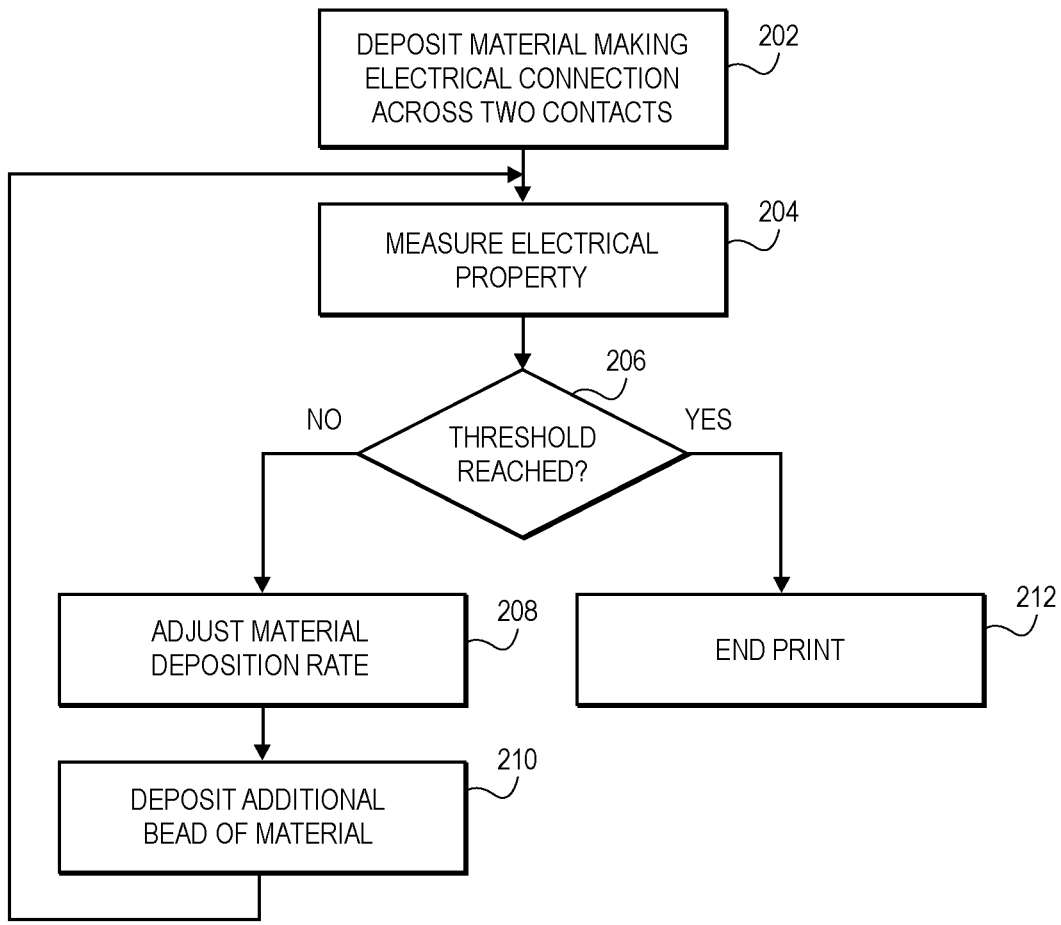
FIG. 2 depicts an exemplary flow chart presenting a process of the invention for manufacturing passive electronic components.

FIG. 2 depicts an exemplary method 200 for additively manufacturing passive electronic components. The process begins at step 202, where material 104 is deposited. Two electrical contacts (interchangeably referred to hereinafter as a first electrical contact and a second electrical contact) are electrically connected by the passive electronic component. In embodiments, for example, when fabricating a resistor, the two electrical contacts may be two lead lines as described above. In some such embodiments, material 104 may be deposited to overlap the lead lines, thereby creating a strong electrical connection. In embodiments, for example, when fabricating a capacitor, the deposited material 104 may form the second electrical contact, thus creating an initially small capacitance between the first electrical contact and the second electrical contact. In some such embodiments, a dielectric layer may be deposited between the first electrical contact and the second electrical contact. In further embodiments, for example, when printing an inductor, a first coil may be printed, thus allowing current to flow and generate an initial inductance. In such a case, the first electrical contact may be placed at the beginning of the first coil and the second electrical contact may be print head 102 of additive manufacturing device 100.

Next, at step 204, an electrical property may be measured across the first electrical contact and the second electrical contact. The measured electrical property may depend on which passive component is printing. For example, the electrical property for a resistor may be resistance, and the resistance may be measured in ohms. Likewise, the electrical property for a capacitor may be capacitance, and the capacitance may be measured in farads. Similarly, for an inductor, the electrical property may be inductance, and the inductance may be measured in Henries. The electrical property may be measured using sensor 128 that may be operably connected to electrical contacts 124.

At step 206, it is determined if a threshold has been reached from the measured electrical property. In embodiments, the threshold is an upper and/or lower limit of a tolerance for the electrical property of the component that is fabricated. As an illustrative example, consider a case where resistor 122 is fabricated to have a resistance of 500-ohms. Resistor 122 may have a manufacturer-set tolerance of 5 ohms; therefore, any resistor 122 that is fabricated having an actual resistance in the range of 495-505 ohms is considered acceptable by the manufacturer based on the use of the resistor and, in some cases, the requirements of the customer. Thus, in this case, the threshold value is 505-ohms. In some embodiments, the threshold may be a percentage value. As an example, the manufacturer may instead have a ±5% tolerance range for resistor 122. In this case, the range of acceptable resistance values is 475-525 ohms, and the threshold value is 525-ohms. In some embodiments, the rate of deposition of the material 104 may be slow enough that the threshold value is the tolerance of the sensor used to detect the electrical property and the material deposition may be stopped when the sensor reads exactly the desired electrical property. In embodiments, the upper value of the range may be used as the threshold value. The upper limit may be used for resistors, because the resistance decreases as more material is added. In other embodiments, the lower value of the range may be used as the threshold value. The lower value may be used for capacitors and inductors, where the capacitance and inductance increase as more material is added to the component as discussed in more detail below.

In some embodiments, to determine if the threshold has been met, processor 130 may subtract the threshold value from the measured value as measured by sensor 128. In the above example, where the tolerance is ±5-ohms, the threshold value is 505-ohms; therefore, if the measured resistance of resistor 122 after the material has been deposited at step 202 is 5000-ohms, then the difference between the measured value and the threshold value is 5000-ohms minus 505-ohms (i.e., 4495-ohms), and the threshold value has not been reached. In this case, the method proceeds to step 208. Alternatively, when the threshold value has been reached, i.e., the measured value equals the threshold value, the method proceeds to step 212.

At step 208, where the threshold value has not been reached, the material deposition rate of additive manufacturing device 100 may be adjusted. Continuing with the above example, as the currently measured resistance is vastly different than the threshold resistance (i.e., 4495-ohms), processor 130 may instruct additive manufacturing device 100 to increase the material deposition rate thereby increasing the manufacturing speed. Alternatively, as an example, if the measured resistance is 507-ohms, and therefore a 2-ohm difference exists between the threshold value and the measured value, processor 130 may instruct additive manufacturing device 100 to slow the material deposition rate. Slowing the material deposition rate when the measured electrical property is near the threshold value allows for resistor 122 to be produced to exactly or near exactly the specified resistance and prevents additive manufacturing device 100 from overshooting its goal and printing excess material. It should be noted that while the material deposition rate may be slowed, the rate of the feedback loop that is constantly measuring the electrical property and adjusting the material deposition rate may not change throughout the process. In some embodiments, processor 130 transmits a digital control signal such as pulse width modulation (PWM) to actuate the additive manufacturing device 100 to change the material deposition rate.

Next, at step 210 an additional bead of material 104 is added to the component. This additional material 104 may cause an immediate change in the measured electrical property value. In the case of resistor 122, the resistance may drop as material 104 is added and the amount of material 104 is increased between the two electrical contacts. For the capacitor and inductor, the capacitance and inductance of the respective component increases as more material is added and the amount of material for current to flow through increases. In some embodiments, the additional bead of material 104 may be deposited onto the second electrical contact. In other embodiments, for example, when printing an inductor, print head 102 may deposit material onto substrate 106 in a concentric pattern.

In some embodiments, once the additional bead has been deposited, the method returns to step 204 and again measures the electrical property. The above-described method then repeats the process of adjusting the material deposition rate of additive manufacturing device 100 and adding additional material 104 until the threshold value is reached at step 206, whereby the method proceeds to step 212.

At step 212, processor 130 signals additive manufacturing device 100 to end the printing process, and the component may be complete. Any additional post-processing steps may be taken after step 212. In some embodiments, material 104 may need to undergo a curing process after printing ends. Additionally, or alternatively, additive manufacturing device 100 may begin constructing a new component to create a circuit or a filter or the like with the completed component.

Figure 3:
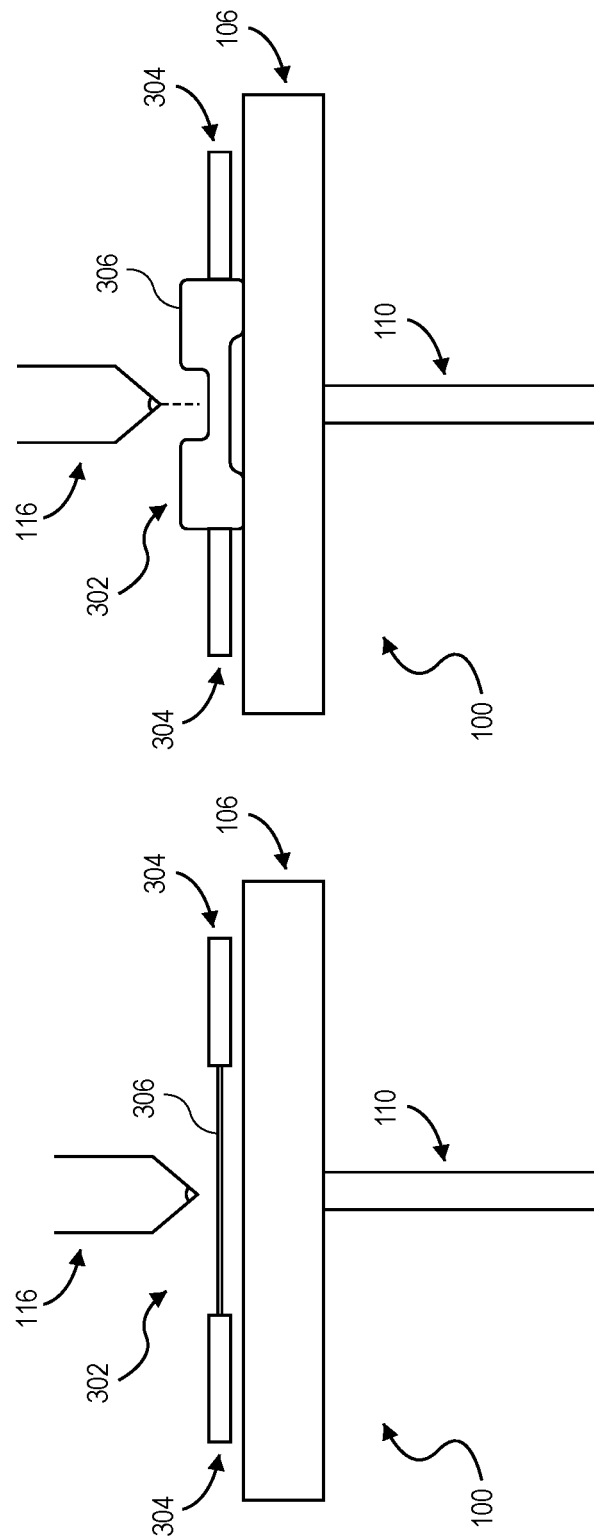
FIG. 3A depicts an exemplary embodiment of the invention showing a beginning stage of printing a resistor.
FIG. 3B depicts an exemplary embodiment of the invention showing a final stage of printing a resistor.

FIG. 3A depicts the printing of resistor 302 at step 202 of method 200 for some embodiments. As shown, resistor 302 is in the beginning stages of being manufactured. Resistor 302 comprises electrical contacts 304, depicted here again as lead lines, and an initial material 306 that has been deposited by additive manufacturing device 100 to create a resistance across electrical contacts 304. As depicted, initial material 306 is a relatively thin line of material having just enough material to create an electrical connection between electrical contacts 304, thereby creating a resistance in resistor 302. In some embodiments, additive manufacturing device 100 may deposit a thicker initial material 306. A thicker initial material 306 may be deposited if it is known that the amount of material will not create an initial resistance below the threshold value. In some embodiments, the amount of initial material 306 may be pre-set for any printed passive component. Once initial material 306 has been deposited, resistor 302 has a finite resistance and method 200 can proceed as described above.

In some embodiments, for example, when a capacitor is printing, the deposition of a second electrode onto the dielectric layer may create the electrical connection and thus provide an initially small capacitance. In some embodiments, the first electrode may be printed to be relatively large, such that when method 200 finishes and all of the material has been added to the second electrode, the first and second electrodes are roughly the same size. In still other embodiments, the first electrode may be sintered before printing the dielectric layer to prevent the first electrode from cracking.

In some embodiments, for example, when an inductor is printing, computer 120 may instruct additive manufacturing device 100 to deposit material 104 in a concentric pattern onto substrate 106 or print bed 108, thereby creating the coils for the inductor. Thus, when the first coil is complete, an inductance can be measured. As material is added and additional coils are printed concentrically, the inductance increases. In some such embodiments, the first coil of the inductor may be sintered to substrate 106 or print bed 108 before printing subsequent coils.

FIG. 3B depicts a completed resistor 302 during step 212 of method 200. The measured electrical property may be approaching the threshold value. In some embodiments, resistors, such as resistor 302, may be fabricated to an electrical property accuracy of about 1%. In some embodiments, resistors may be fabricated to an electrical property accuracy of between about 1% and about 0.1%. In some embodiments, resistors may be fabricated to an electrical property accuracy of less than about 0.1%. As depicted, resistor 302 may comprise an irregularly shaped cross-section when finished. Due to method 200 ending the printing process based on the measured value and not on a predefined geometry, the printed component may be completed "mid-bead" if the desired value is reached partway through step 210 where an additional bead is in the process of being deposited. Therefore, irregularly shaped components may be produced using the methods described herein. The shape of the component may not affect the electrical property, only the amount of material between the electrodes. Consequently, the production of the component may stop at any point when the electrical property is exactly, or near exactly, the desired electrical property value.

As described above, after step 212, the completed components may undergo any post-processing steps. In some embodiments, resistor 302 and electrical contacts 304 may be sintered together after the component is fully deposited.

In some embodiments, because the shape of the passive components may not affect the electrical property, passive components may be constructed to provide surge protection benefits. For example, resistor 302 may be produced comprising a thinner cross-sectional area in a middle section as shown in FIG. 3B. Therefore, if an electrical surge occurs, the middle of resistor 302 will burn out first and the surge will be contained to only resistor 302 and not be passed along to any other components that may be connected to resistor 302. The varying cross-section may be produced by sensor 128 continuously detecting the position of print head 102 and/or print bed 108 and transmitting positional information to processor 130. When processor 130 detects printing is occurring in a section that is programmed to comprise a smaller cross section, processor 130 may signal computer 120 to reduce the material deposition rate of additive manufacturing device 100. Thus, less material will be printed in this portion of resistor 302. When sensor 128 detects additive manufacturing device 100 is again printing towards the outer portions of resistor 302, processor 130 may signal additive manufacturing device 100 to increase the material deposition rate. As a final result, resistor 302 comprises a small cross-sectional area relative to the outer edges such that when a power surge occurs, resistor 302 may burn out stopping the power surge from reaching more valuable electronic components in the circuit.

In some embodiments, resistor 302 may comprise inks such as carbon ink ruthenate ink, graphite ink, polyimide ink, or various metallic-based conductive inks. In other embodiments, resistor 302 may comprise conductive metal pastes such as gold, silver, platinum, or the like. In still other embodiments, resistor 302 may comprise a thermoplastic material such as polylactic acid (PLA) or polypropylene-based thermoplastics. Broadly speaking, resistor 302 may comprise any material now known or later developed that is operable to be printed via additive manufacturing methods and provides the desired operational resistance when printed.

Figure 4:
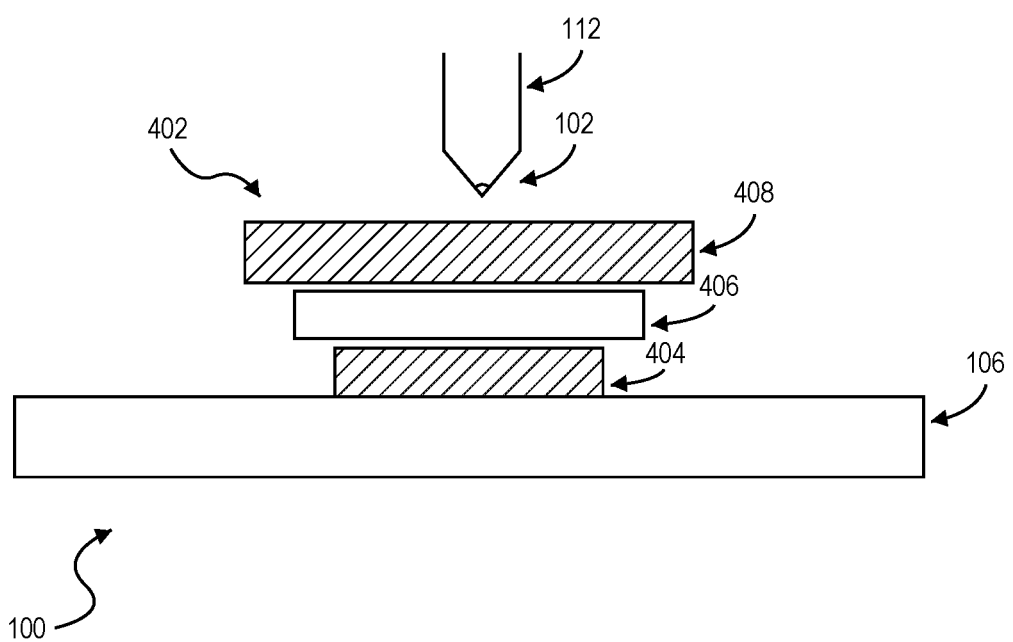
FIG. 4 depicts an exemplary embodiment of the invention showing a printed capacitor.

FIG. 4 depicts a finished capacitor 402 for some embodiments. In some embodiments, capacitors, such as capacitor 402, may be manufactured to an electrical property accuracy of about 1%. In some embodiments, capacitors may be fabricated to an electrical property accuracy of between about 1% and about 0.1%. In some embodiments, capacitors may be fabricated to an electrical property accuracy of less than about 0.1%. As depicted, capacitor 402 comprises three parts: first electrode 404, dielectric layer 406, and second electrode 408. Capacitor 402 may be manufactured using the above-described method 200. In some embodiments, printing a capacitor may also comprise steps occurring before step 202. For example, additive manufacturing device 100 may print first electrode 404 before step 202, where material is printed to make an electrical connection across two contacts. Alternatively, first electrode 404 may be manufactured using other common techniques and additive manufacturing device 100 may only print second electrode 408. In some embodiments, after first electrode 404 is printed on or added to substrate 106 or print bed 108, additive manufacturing device 100 may also print dielectric layer 406 comprising a dielectric material on top of first electrode 404. In still other embodiments, dielectric layer 406 may be the same size or larger than first electrode 404. Dielectric layer 406 may be a material such as paper, plastic, glass, mica or a ceramic or any other dielectric material now known or later discovered. Alternatively, dielectric layer 406 may be prefabricated and placed on top of first electrode 404. In still other embodiments, dielectric layer 406 may be air and first electrode 404 and second electrode 408 be manufactured in the same plane, with a dielectric air gap between first electrode 404 and second electrode 408. In some embodiments, first electrode 404 may be a pre-determined standard size and shape and second electrode 408 may be deposited to increase the capacitance between first electrode and 404 and second electrode 408. In some embodiments, additive manufacturing device 100 may be configured with a plurality of reservoirs 114 for when multiple materials are used to manufacture the passive device. For example, additive manufacturing device 100 may comprise a plurality of reservoirs for printing capacitors with at least one reservoir for holding material for dielectric layer 406.

Once first electrode 404 and dielectric layer 406 have been added to print bed 108, step 202 may proceed, and second electrode 408 may be deposited. When second electrode 408 begins to be deposited, a capacitance may now be measured by sensor 128 across first electrode 404 and second electrode 408. Second electrode 408 may initially be very small in size to create an initially small capacitance. In an exemplary embodiment for manufacturing capacitor 402, each additional bead of material 104 deposited at step 210 may be deposited onto second electrode 408. Thus, in some embodiments, first electrode 404 may be printed to be relatively large, such that when the desired capacitance has been reached, first electrode 404 and second electrode 408 may be close to or equivalent in size to produce a more uniform component. In some embodiments, as shown in FIG. 4, first electrode 404 and second electrode 408 are different sizes. Second electrode 408 may be deposited until the electrical property threshold is reached, thus resulting in different sizes of electrodes but providing exact or near exact desired capacitance.

In some embodiments, first electrode 404 and second electrode 408 forming capacitor 402 may comprise an electrically-conductive filament such as PLA, graphene filament, or the like. In other embodiments, capacitor 402 may comprise powders such as carbon-based powder, zinc powder, and the like. In still other embodiments, capacitor 402 may comprise metal pastes such as, nickel-based pastes, copper-based pastes, or silver-based metal pastes. In still other embodiments, capacitor 402 may comprise a ceramic material such as barium titanite. In embodiments, capacitor 402 may comprise polymer materials such as poly(3,4-ethylendioxythiophene):poly(stryenesulfonate) (PEDOT:PSS) Broadly speaking, capacitor 402 may comprise any material now known or later developed that is operable to be printed via additive manufacturing methods and provides the desired operational capacitance when printed.

Figure 5:
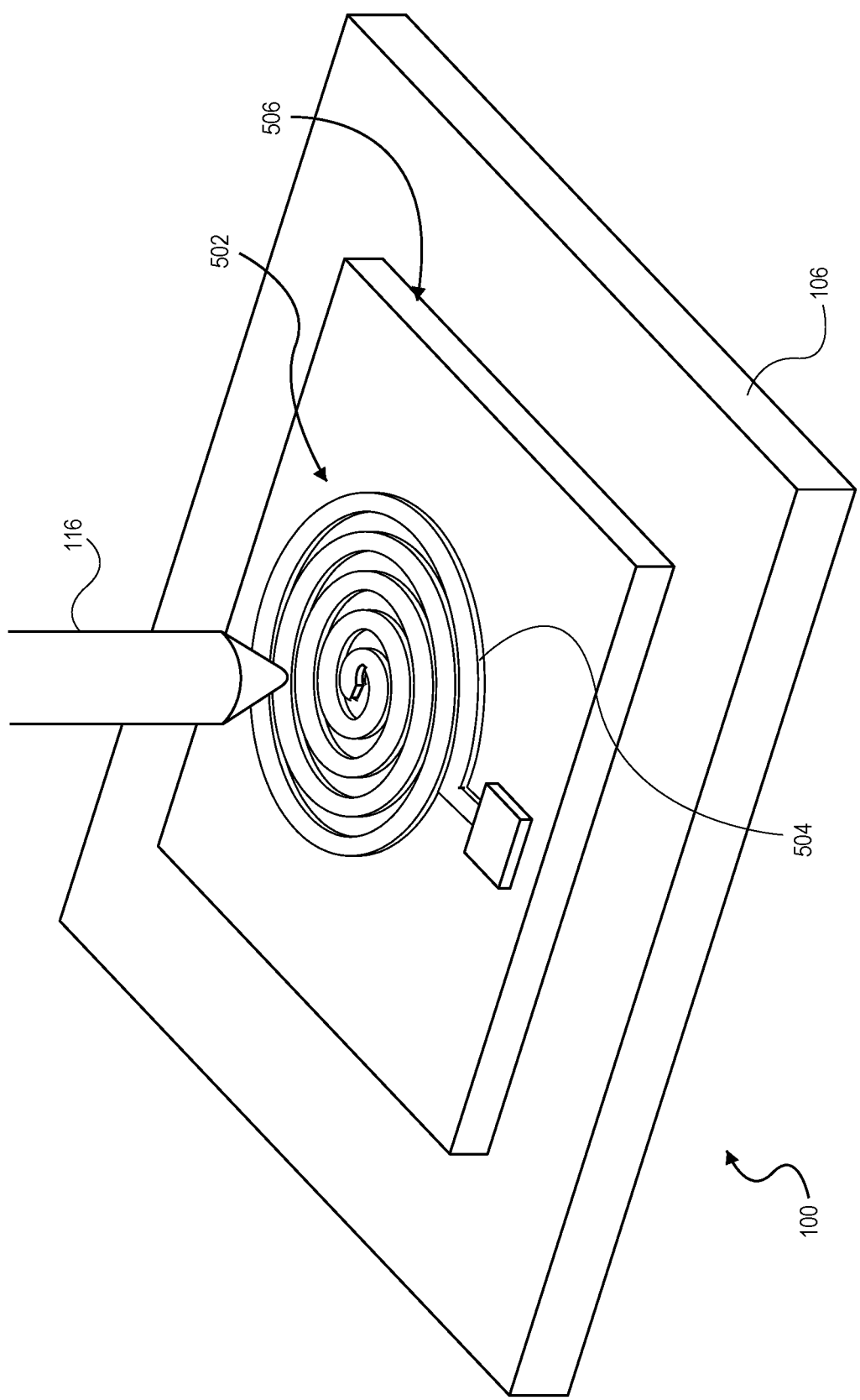
FIG. 5 depicts an exemplary embodiment of the invention showing a printed inductor.

FIG. 5 depicts a finished inductor 502 for some embodiments. In some embodiments, inductors, such as inductor 502, may be manufactured to an electrical property accuracy of about 1%. In some embodiments, inductors may be fabricated to an electrical property accuracy of between about 1% and about 0.1%. In some embodiments, inductors may be fabricated to an electrical property accuracy of less than about 0.1%. The printing process for inductor 502, in some embodiments, begins with first coil 504 deposited at step 202. When first coil 504 is printed, an inductance may be measured across inductor 502 using sensor 128 and a signal indicative of the inductance sent to processor 130 as described above. In some embodiments, print head 102 of additive manufacturing device 100 serves as an electrical contact for manufacturing inductor 502. Using print head 102 as an electrical contact may be useful because the contact point for measuring the inductance across inductor 502 may be constantly changing. After first coil 504 is printed, additive manufacturing device 100 continues printing concentric coils until the desired inductance is reached. In some embodiments, inductor 502 may be printed on top of insulating layer 506. In other embodiments, insulating layer 506 may be disposed on top of inductor 502 after printing has finished. In some embodiments, insulating layer 506 may be printed by additive manufacturing device 100. In some embodiments, additional components may be added to inductor 502 before, during, or after the printing process. For example, materials comprising high magnetic permeability and low electrical conductivity that are commonly used as cores for conventionally manufactured inductors, such as a ferrite, may be added to inductor 502. In some embodiments, the magnetic material may be powdered-iron or laminated silicon steel or the like. In some embodiments, the magnetic material may be printed as an additional layer on top or below inductor 502.

In some embodiments, inductor 502 may comprise metallic pastes such as nickel-based pastes, iron-based pastes, copper-based pastes, silver-based pastes, molybdenum-based pastes, or the like. In some embodiments, inductor 502 may comprises a graphene-based filament. Broadly speaking, inductor 502 may comprise any material now known or later developed that is operable to be printed via additive manufacturing methods and provides the desired operational inductance when printed.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A system for additively manufacturing passive electronic components, the system comprising:
    a first electrical contact;
    a second electrical contact;
    an additive manufacturing device configured to deposit a print material onto a substrate;
    a sensor operably connected to the first electrical contact and the second electrical contact and configured to measure an electrical property of a passive electronic component across the first electrical contact and the second electrical contact; and
    one or more non-transitory computer-readable media storing computer-executable instructions that, when executed by at least one processor, cause the system to carry out actions, comprising:
        receiving, from the sensor, a first signal indicative of a measured electrical property value;
        determining, based on the first signal, if the measured electrical property value has reached a threshold value;
        when the measured electrical property value has not reached the threshold value, adjusting a material deposition rate of the additive manufacturing device based on a difference between the measured electrical property value and the threshold value;
        when the measured electrical property value reaches the threshold value, signaling the additive manufacturing device to end deposition of the print material, wherein the threshold value is selected based on a change in the electrical property of the passive electronic component due to an amount of print material deposited during a delay resulting from the sensor detecting the measured electrical property value is the threshold value and the at least one processor signaling the additive manufacturing device to end the deposition such that the passive electronic component has a final electrical property value distinct from the threshold value.

2. The system of claim 1, wherein the passive electronic component is one of a resistor, a capacitor, or an inductor.

3. The system of claim 2,
    wherein the passive electronic component is the resistor, and the measured electrical property value is a resistance value, and
    wherein the print material is deposited between the first electrical contact and the second electrical contact.

4. The system of claim 3, wherein actions further comprise: transmitting, to the additive manufacturing device, a signal to reduce the material deposition rate based at least in part on a position of a print head of the additive manufacturing device.

5. The system of claim 2,
    wherein the passive electronic component is the capacitor, and the measured electrical property is capacitance,
    wherein the first electrical contact is a pre-determined size, and
    wherein the print material is deposited opposite a dielectric material to increase the capacitance.

6. The system of claim 5, wherein a dielectric layer is deposited onto the first electrical contact and the second electrical contact is deposited onto the dielectric layer increasing the capacitance as the print material is added.

7. The system of claim 2,
    wherein the passive electronic component is the inductor, and the measured electrical property is inductance, and
    wherein the first electrical contact is the print material, and the second electrical contact is a print head of the additive manufacturing device.

8. The system of claim 7,
    wherein the system further comprises an insulating layer comprising an insulating material, and
    wherein the inductor is deposited onto the insulating layer.

9. The system of claim 1, wherein the actions further comprise:
    determining a difference between the measured electrical property value and the threshold value; and
    reducing the material deposition rate as the difference between the measured electrical property value and the threshold value decreases.

10. A method for additively manufacturing passive electronic components, the method comprising:
    depositing a first amount of a print material onto a substrate using an additive manufacturing device;
    measuring an electrical property of a passive electronic component across a first electrical contact and a second electrical contact using a sensor operably connected to the first electrical contact and the second electrical contact;
    transmitting, from the sensor, a first signal indicative of a measured electrical property value to at least one processor;
    determining, based on the first signal, if the measured electrical property value has reached a threshold value;
    when the measured electrical property value has not reached the threshold value, adjusting a material deposition rate of the additive manufacturing device while the additive manufacturing device is depositing the print material based on a difference between the measured electrical property value and the threshold value;

depositing a second amount of the print material onto the substrate;

determining when the measured electrical property value has reached the threshold value; and when the measured electrical property value has reached the threshold value, ending the deposition of the print material, wherein the threshold value is selected based on a change in the electrical property of the passive electronic component due to an amount of print material deposited during a delay resulting from the sensor detecting the measured electrical property value is the threshold value and the at least one processor signaling the additive manufacturing device to end the deposition such that the passive electronic component has a final electrical property value distinct from the threshold value.

11. The method of claim 10, wherein the passive electronic component is one of a resistor, a capacitor, or an inductor.

12. The method of claim 11, wherein the passive electronic component is the resistor, and the measured electrical property value is a resistance value, wherein the print material is deposited between the first electrical contact and the second electrical contact; and further comprising transmitting a signal to the additive manufacturing device to reduce the material deposition rate based at least in part on a position of a print head of the additive manufacturing device.

13. The method of claim 11, wherein the passive electronic component is the capacitor, and the measured electrical property is capacitance, depositing the print material onto the second electrical contact to increase the capacitance of the capacitor; and depositing a layer of dielectric material between the first electrical contact and the second electrical contact.

14. The method of claim 11, wherein the passive electronic component is the inductor, and the electrical property is inductance, wherein the first electrical contact is the print material, and the second electrical contact is a print head of the additive manufacturing device, and the method further comprising depositing the inductor onto an insulating layer.

15. The method of claim 10, wherein the passive electronic component is conformally printed onto the substrate.

16. A system for additively manufacturing passive electronic components, the system comprising:

at least one processor; and one or more non-transitory computer-readable media storing computer-executable instructions that, when executed by the at least one processor, cause the system to carry out actions, comprising:

depositing, by an additive manufacturing device, a first electrical contact;

depositing, by the additive manufacturing device, print material to electrically connect the first electrical contact to a second electrical contact;

receiving, from a sensor operably connected to the first electrical contact and the second electrical contact, a signal indicative of a measured electrical property value of a passive electronic component across the first electrical contact and the second electrical contact;

determining, based on the signal, if the measured electrical property value has reached a threshold value;

responsive to determining the measured electrical property value has not reached the threshold value, adjusting a material deposition rate of the additive manufacturing device based on a difference between the measured electrical property value and the threshold value;

responsive to determining the measured electrical property value has reached the threshold value, ending the deposition of the print material, wherein the threshold value is selected based on a change in the measured electrical property value of the passive electronic component due to an amount of print material deposited during a delay resulting from the sensor detecting the measured electrical property value is the threshold value and the at least one processor signaling the additive manufacturing device to end deposition such that the passive electronic component has a final electrical property value distinct from the threshold value.

17. The system of claim 16, wherein the passive electronic component is conformally printed onto a substrate.

18. The system of claim 16, wherein the passive electronic component is a resistor, and the predefined measured electrical property value is a resistance value, wherein the print material is deposited between the first electrical contact and the second electrical contact, and wherein the material deposition rate is reduced based at least in part on a position of a print head of the additive manufacturing device.

19. The system of claim 16, further comprising a layer of dielectric material deposited between the first electrical contact and the second electrical contact, wherein the passive electronic component is a capacitor, and the measured electrical property value is a capacitance value, wherein the first electrical contact is a pre-determined size, and wherein the print material is deposited onto the second electrical contact to increase the capacitance value of the capacitor.

20. The system of claim 16, wherein the passive electronic component is an inductor, and the measured electrical property value is an inductance value, wherein the first electrical contact is the print material, and the second electrical contact is a print head of the additive manufacturing device.

\* \* \* \* \*